US012621941B2

(12) United States Patent
Wang et al.

(10) Patent No.: US 12,621,941 B2
(45) Date of Patent: May 5, 2026

(54) SCROLL DEVICE AND SCROLLABLE DISPLAY

(71) Applicant: E Ink Holdings Inc., Hsinchu (TW)

(72) Inventors: Hsing-Kai Wang, Hsinchu (TW); Chia-Chun Yeh, Hsinchu (TW); Chen-Chu Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 129 days.

(21) Appl. No.: 18/614,741

(22) Filed: Mar. 25, 2024

(65) Prior Publication Data

US 2024/0357755 A1      Oct. 24, 2024

(30) Foreign Application Priority Data

Apr. 21, 2023    (TW) ................................. 112114873

(51) Int. Cl.
      *H05K 5/02*          (2006.01)
      *G06F 1/16*          (2006.01)
(52) U.S. Cl.
      CPC ......... *H05K 5/0217* (2013.01); *G06F 1/1652* (2013.01)
(58) Field of Classification Search
      CPC ...... H05K 5/0217; G06F 1/1652; G09F 9/301
      See application file for complete search history.

(56) References Cited

U.S. PATENT DOCUMENTS

| | | | |
|---|---|---|---|
| 10,146,260 B2 | 12/2018 | Lee et al. | |
| 10,564,676 B2 | 2/2020 | Kwon et al. | |
| 10,617,017 B2 | 4/2020 | Park et al. | |
| 10,701,821 B2 | 6/2020 | Kim et al. | |
| 10,877,525 B2 | 12/2020 | Kang et al. | |
| 2011/0305493 A1* | 12/2011 | Wu ........................ | G06F 3/0221 |
| | | | 400/472 |
| 2019/0037716 A1* | 1/2019 | Kim ...................... | G06F 1/1652 |
| 2020/0077194 A1* | 3/2020 | Kim ...................... | H04R 9/025 |
| 2021/0375165 A1* | 12/2021 | Feng ...................... | G09F 9/301 |
| 2022/0151092 A1* | 5/2022 | Cho ...................... | H05K 5/0217 |

(Continued)

FOREIGN PATENT DOCUMENTS

| | | |
|---|---|---|
| CN | 110738932 A | 1/2020 |
| CN | 111559235 A | 8/2020 |
| TW | M548811 U | 9/2017 |

OTHER PUBLICATIONS

Machine translation of TWM548811 (Year: 2025).*
The office Action of corresponding TW application No. 112114873 issued on Oct. 11, 2023.

*Primary Examiner* — Sagar Shrestha
(74) *Attorney, Agent, or Firm* — CKC & Partners Co., LLC

(57)                ABSTRACT

A scrollable device including a fixture, a flexible display panel and a scroll device having a roller, a roller end cap and a torsion spring is provided. One side of the flexible display panel is connected to the fixture, while the other side is connected to the cylindrical surface of the roller. The roller end cap is rotatably disposed on the end part of the roller, and the torsion spring is inside the roller. One end of the torsion spring is connected to the roller, while the other end is connected to the roller end cap. When a relative rotation between the roller and the roller end cap is occurred, the torsion spring is rotated and deformed to form a restoring force. This restoring force can drive the roller to rotate relative to the roller end cap, thereby making the flexible display panel to roll up along the roller.

13 Claims, 7 Drawing Sheets

(56)          References Cited

U.S. PATENT DOCUMENTS

| | | | |
|---|---|---|---|
| 2022/0295651 A1* | 9/2022 | Valeriy ................. | G06F 1/1652 |
| 2022/0337688 A1* | 10/2022 | Sang ..................... | G06F 1/1652 |
| 2023/0217610 A1* | 7/2023 | Lee ....................... | G06F 1/1652 |
| | | | 361/807 |

\* cited by examiner

SCROLL DEVICE AND SCROLLABLE DISPLAY

RELATED APPLICATIONS

This application claims priority to Taiwan Application Serial Number 112114873, filed Apr. 21, 2023, which is herein incorporated by reference in its entirety.

BACKGROUND

Technical Field

The present disclosure relates to a scroll device and a scrollable display using this scroll device. More particular, the present disclosure relates to the scrollable display and its scroll device which are provided with restoring force.

Description of Related Art

The flexible display is classified into different types according to the bending way, such as bendable displays and scrollable displays. Among these types, the bending strain of the scrollable display is relatively larger than the others. Thus, a larger torque is necessary for the display panel to be rolled up during the rolling process. In present, the scrollable display has a roller where the flexible display panel can be rolled up, and the flexible display panel can be curled on the roller along its rotation axis.

Generally, the spin of the roller in the scrollable display is driven by one motor system providing sufficient torque for the panel to be curled. In addition, the movement (e.g. displacement) of the roller should be driven by another motor system to coordinate the curling or flattening of the panel, so that the display panel is rolled up or unrolled. Since the operation of coordinating two motor systems is necessary, the scroll devices of scrollable displays in present are large, so as to dispose those motors. Furthermore, the circuit design and the mechanical structure of the scrollable displays are more complicated.

SUMMARY

Accordingly, the disclosure is to provide a scrollable display. This scrollable display includes the torsion spring, and the roller of the scroll device is driven to rotate by the restoring force produced by the torsion spring.

An embodiment of the disclosure provides a scroll device including the torsion spring, and the roller is driven to rotate by the restoring force produced by the torsion spring.

At least one embodiment of the disclosure provides a scrollable display including a fixture, a flexible display panel and a scroll device. The flexible display panel has a first side and a second side opposite to the first side, where the first side is connected to the fixture. The scroll device includes a first roller end cap and a roller having a cylindrical surface, and the second side of the flexible display panel is connected to the cylindrical surface of the roller, where one of two end parts of the roller disposed on the first roller end cap is rotatable, and the roller is able to rotate relative to the first roller end cap. A first torsion spring located inside the roller, and two ends of the first torsion spring are connected to the roller and the first roller end cap separately, where the relative rotation between the roller and the first roller end cap makes the first torsion spring twist. A driving device for moving the first roller end cap relative to the fixture is connected to the first roller end cap. The driving device has two tracks separately located on two opposite sides of the driving device, and the two tracks are located between the two end parts of the roller. When the flexible display panel is in a first state, the first torsion spring drives the roller to rotate relative to the first roller end cap, and the flexible display panel is rolled up on the roller and is curled on the cylindrical surface. When the flexible display panel is in a second state, a part of the flexible display panel between the fixture and the roller is unrolled. The first torsion spring in the second state deforms to form a first restoring force, and the first restoring force drives the roller to draw the flexible display panel.

At least in one embodiment of the disclosure, the driving device in the first state drives the first roller end cap to move toward the fixture, and the driving device in the second state drives the first roller end cap to move away from the fixture.

At least in one embodiment of the disclosure, the roller is connected to and directly touches a surface of the flexible display panel, and the surface faces the driving device.

At least in one embodiment of the disclosure, the roller is connected to and directly touches a surface of the flexible display panel, and the surface backs on to the driving device.

At least in one embodiment of the disclosure, the scrollable display further includes a bearing located between the roller and the first roller end cap, and the bearing allows the roller and the first roller end cap to rotate relative to each other.

At least in one embodiment of the disclosure, the scroll device further includes a bracing rod located inside the first torsion spring. The axis of the bracing rod extends along the extending direction of the first torsion spring, and a length of the bracing rod is less than a length of the first torsion spring.

At least in one embodiment of the disclosure, the scroll device further includes a bracing rod located inside the first torsion spring. The axis of the bracing rod extends along the extending direction of the first torsion spring, and a length of the bracing rod is equal to a length of the first torsion spring.

At least in one embodiment of the disclosure, the roller further includes a fastening device fastened inside the roller, and one end of the first torsion spring is connected to the fastening device.

At least in one embodiment of the disclosure, the scroll device further includes a second roller end cap. The other end part of the roller disposed on the second roller end cap is rotatable, and the roller is able to rotate relative to the second roller end cap, where the roller is located between the first roller end cap and the second roller end cap. A second torsion spring located inside the roller, and two ends of the second torsion spring are connected to the fastening device and the second roller end cap separately, where the fastening device is located between the first torsion spring and the second torsion spring. The second torsion spring in the second state deforms to form a second restoring force, and the second restoring force drives the roller to draw the flexible display panel.

At least in one embodiment of the disclosure, the first torsion spring has a third restoring force when a distance between the roller and the fixture is minimal, and the third restoring force is used to draw the flexible display panel.

At least in one embodiment of the disclosure provides a scroll device includes a roller, a first roller end cap, a first torsion spring, a second roller end cap and a second torsion spring. One of two end parts of the roller disposed on the first roller end cap is rotatable, and the roller is able to rotate relative to the first roller end cap. The first torsion spring located inside the roller, and two ends of the first torsion spring are fastened to the roller and the first roller end cap separately. The other one of two end parts of the roller disposed on the second roller end cap is rotatable, and the roller is able to rotate relative to the second roller end cap. The second torsion spring located inside the roller, and two ends of the second torsion spring are connected to the roller and the second roller end cap separately.

At least in one embodiment of the disclosure, the scroll device further includes a bearing located between the roller and the first roller end cap, and the bearing allows the roller and the first roller end cap to rotate relative to each other.

At least in one embodiment of the disclosure, the roller further includes a fastening device fastened inside the roller, and one of the two ends of the first torsion spring is connected to the fastening device.

At least in one embodiment of the disclosure, the scroll device further includes a bracing rod located inside the first torsion spring. An axis of the bracing rod extends along the extending direction of the first torsion spring, and a length of the bracing rod is less than a length of the first torsion spring.

At least in one embodiment of the disclosure, the scroll device further includes a bracing rod located inside the first torsion spring. An axis of the bracing rod extends along the extending direction of the first torsion spring, and a length of the bracing rod is equal to a length of the first torsion spring.

According to the aforementioned embodiments, the torsion spring with two ends connected to the roller end cap and the roller produce the restoring force which can drive relative rotation between the roller end cap and the roller, thereby causing the flexible display panel to be curled on the cylinder surface of the roller. The removal of the motor which drives the rotation of the roller can not only minify the scrollable display but simplify the circuit design and the mechanical structure.

BRIEF DESCRIPTION OF THE DRAWINGS

To illustrate more clearly the aforementioned and the other objects, features, merits, and embodiments of the present disclosure, the description of the accompanying figures are as follows.

DETAILED DESCRIPTION

Figure 1:
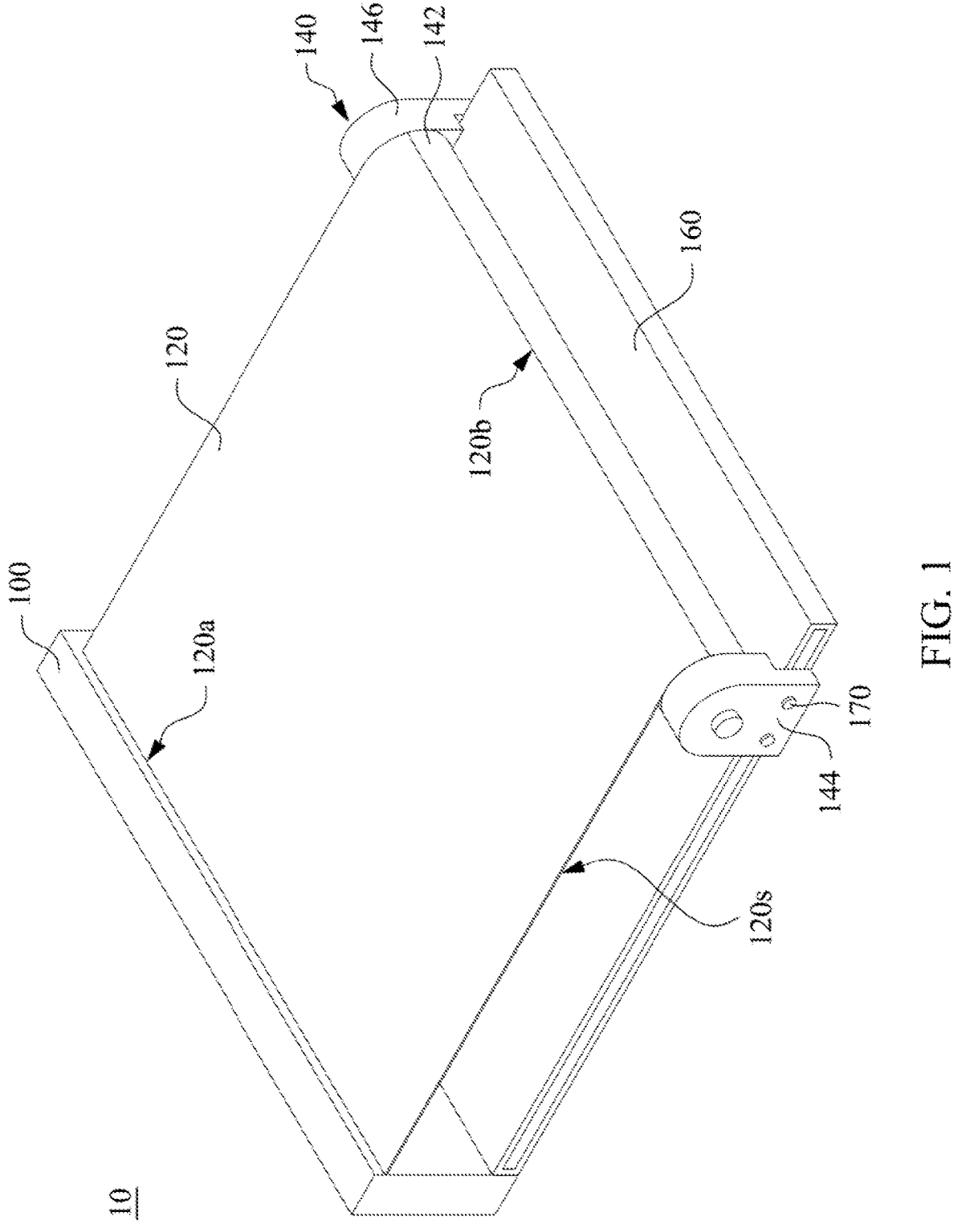
FIG. 1 illustrates a stereographic view of a scrollable display in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, the dimensions (such as lengths, widths and thicknesses) of components (such as layers, films, substrates and regions) in the drawings are enlarged not-to-scale, and the number of components may be reduced in order to clarify the technical features of the disclosure. Therefore, the following illustrations and explanations are not limited to the number of components, the number of components, the dimensions and the shapes of components, and the deviation of size and shape caused by the practical procedures or tolerances are included. For example, a flat surface shown in drawings may have rough and/or non-linear features, while angles shown in drawings may be circular. As a result, the drawings of components shown in the disclosure are mainly for illustration and not intended to accurately depict the real shapes of the components, nor are intended to limit the scope of the claimed content of the disclosure.

FIG. 1 illustrates a stereographic view of the scrollable display 10 in accordance with one embodiment of the present disclosure. Referring to FIG. 1, the scrollable display 10 includes the fixture 100, the flexible display panel 120 and the scroll device 140. As shown in FIG. 1, the flexible display panel 120 has the side surface 120a and the side surface 120b opposite to the side surface 120a. The side surface 120a is connected and fixed to the fixture 100, while the side surface 120b is connected and fixed to the scroll device 140. In the embodiment, the flexible display panel 120 may be an electrophoretic display (EPD) panel, a cholesteric liquid crystal display (ChLCD) panel, organic light-emitting diodes (OLEDs) display or similarity thereof.

Figure 2:
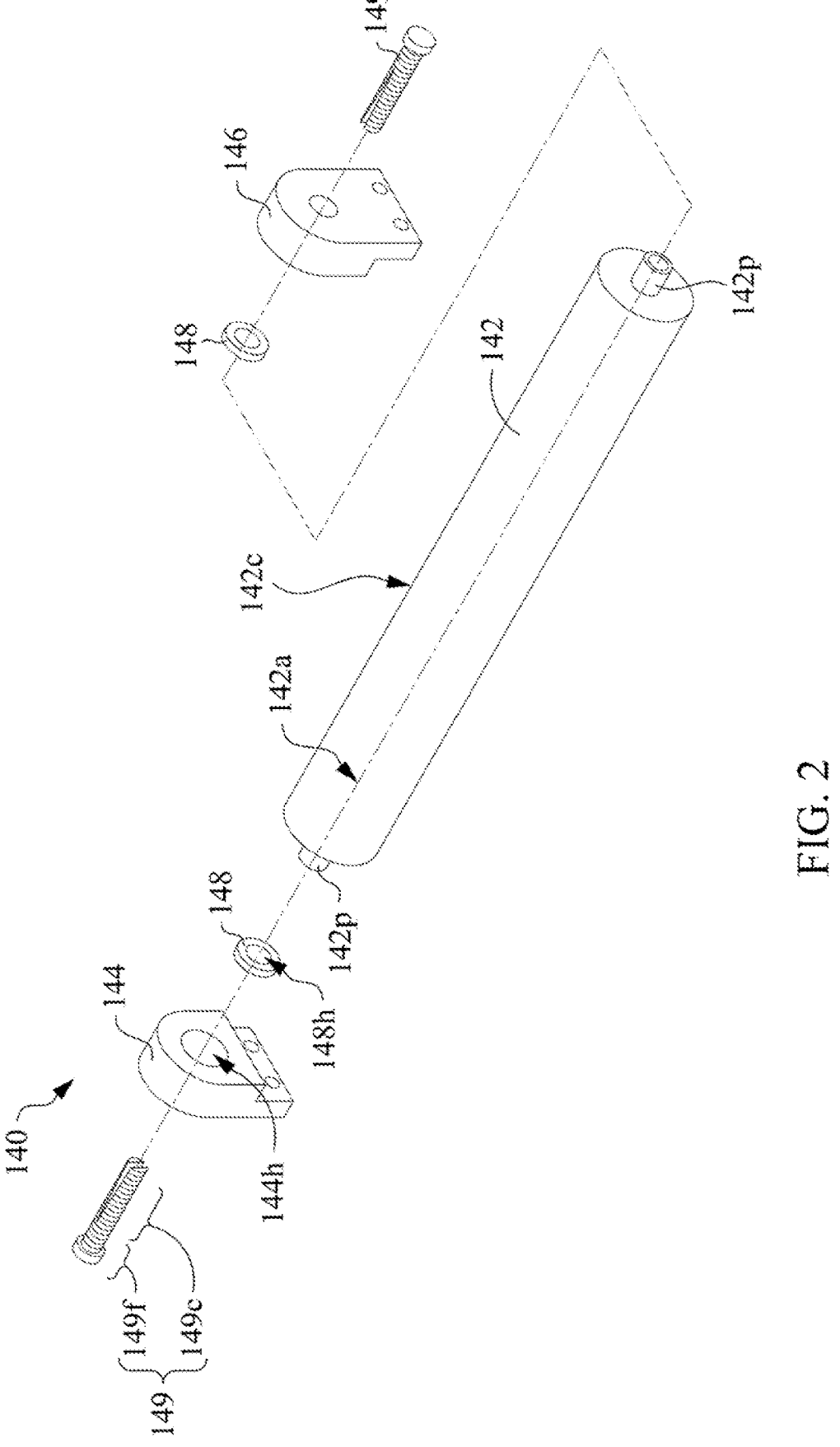
FIG. 2 illustrates a locally exploded view of a scrollable display in accordance with one embodiment of the present disclosure.

FIG. 2 illustrates a locally exploded view of the scroll device 140 in accordance with one embodiment of the present disclosure. The scroll device 140 includes the roller 142, the roller end cap 144 and the roller end cap 146, and the roller 142 is located between the roller end cap 144 and the roller end cap 146. The roller 142 has the cylindrical surface 142c and two end parts 142p. Referring to FIG. 1 and FIG. 2, the side surface 120b of the flexible display panel 120 is connected fixed to the cylindrical surface 142c of the roller 142. One of the end parts 142p of the roller 142 disposed on the roller end cap 144 is rotatable, so that the roller 142 is able to rotate relative to the roller end cap 144. On the other hand, the other one of the end parts 142p of the roller 142 disposed on the roller end cap 146 is rotatable, so that the roller 142 is able to rotate relative to the roller end cap 146.

Referring to FIG. 2, the scroll device 140 of this embodiment further includes two bearings 148 which are located on the end parts 142p separately. One of the bearings 148 is located between the roller 142 and the roller end cap 144, so that this one of the bearings 148 allows the roller 142 and the roller end cap 144 to rotate relative to each other. The other one of the bearings 148 is located between the roller 142 and the roller end cap 146, so that this one of the bearings 148 allows the roller 142 and the roller end cap 146 to rotate relative to each other.

Figure 3A:
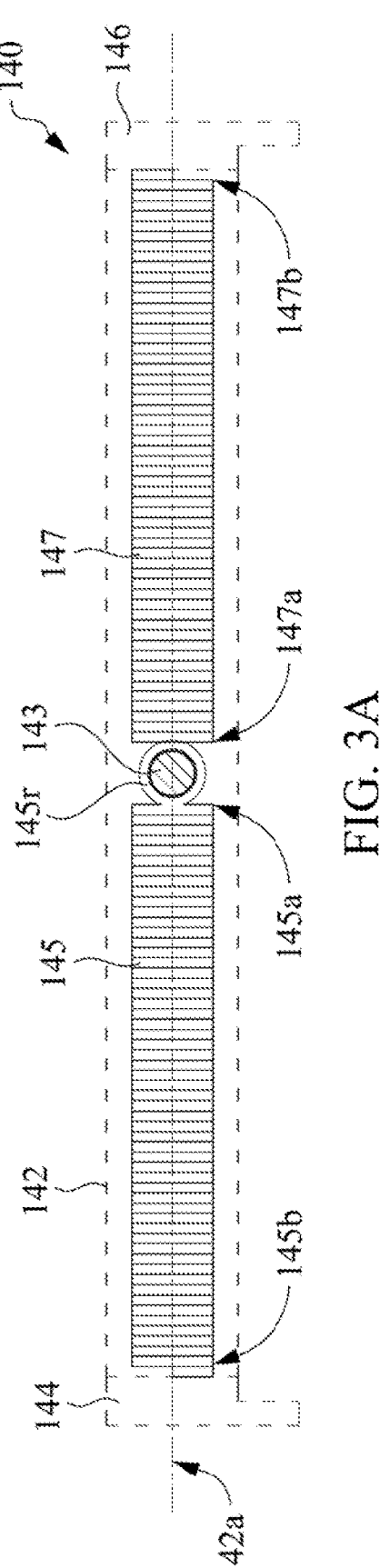
FIG. 3A illustrates a locally side view of a scroll device of FIG. 1.
Figure 3B:
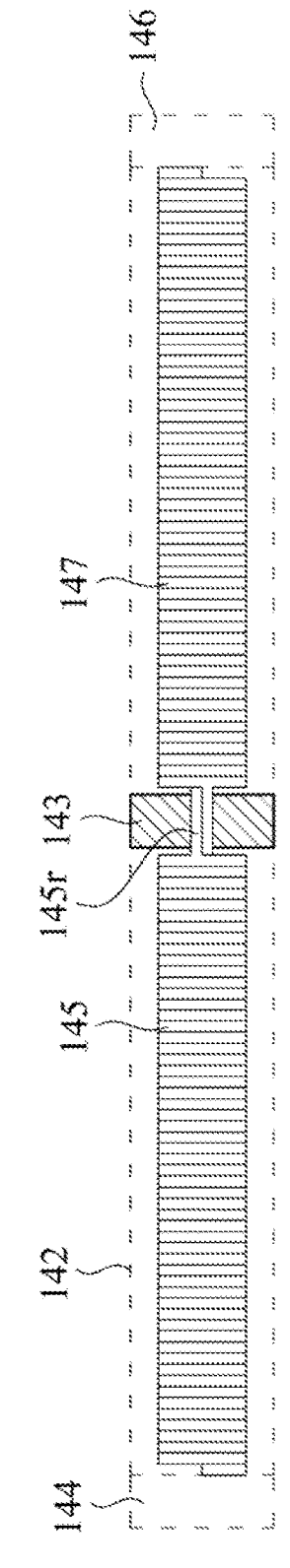
FIG. 3B illustrates a top view of a scroll device of FIG. 3A.

FIG. 3A illustrates the locally side views of the scroll device 140 of FIG. 1, and FIG. 3B illustrates the top view of the scroll device 140 of FIG. 3A. As shown in FIG. 3A, the scroll device 140 includes the torsion spring 145 and the torsion spring 147. The torsion spring 145 and the torsion spring 147 are located inside the roller 142, where two ends of the torsion spring 145 are connected to the inner part of the roller 142 (depicted in FIG. 3A by dotted line) and the roller end cap 144 (depicted in FIG. 3A by dotted line) separately. And two ends of the torsion spring 147 are connected to the inner part of the roller 142 and the roller end cap 146 (depicted in FIG. 3A by dotted line).

Referring to FIG. 3A and FIG. 3B, the roller 142 further includes the fastening device 143. As shown in FIG. 3B, the torsion spring 145 and the torsion spring 147 are connected to the roller 142 by the fastening device 143. For example, the fastening device 143 may be a bolt, and two end parts (not shown) of this bolt are fasten inside the roller 142 separately. Referring to FIG. 3A, the end 145a of the torsion spring 145 may include the ring structure 145r, and the end 145a of the torsion spring 145 is connected to the fastening device 143 by hitching the bolt (i.e. the fastening device 143) with the ring structure 145r, while the end 145b of the torsion spring 145 is connected and fixed to the roller end cap 144. The end 147a of the torsion spring 147 may be connected to the fastening device 143 by the same way, but the end 147b of the torsion spring 147 is connected to the roller end cap 146. Thus, the fastening device 143 is located between the torsion spring 145 and the torsion spring 147.

It is worth mentioning, the fastening device 143 of the embodiment are not limited to be a bolt. The fastening device 143 may be any other parts or structures suitable for one end of the torsion spring 145 (and the torsion spring 147) to be connected.

Referring to FIG. 2, the scroll device 140 of this embodiment further includes two connecting devices 149. In the embodiment, the connecting device 149 may be a split rivet which has the split portion 149c on one end and the fasten portion 149f on the other end. As shown in FIG. 2, the fasten portion 149f of the connecting device 149 may be bolted on the roller end cap 144, so that the connecting device 149 is fastened inside the roller end cap 144. Thus, the roller end cap 144 is not rotatable relative to the connecting device 149. On the other hand, the split portion 149c of the connecting device 149 may pass through the hole 144h of the roller end cap 144 and the hole 148h of the bearings 148 sequentially, and then plug into the roller 142 through the end part 142p of the roller 142.

Figure 4:
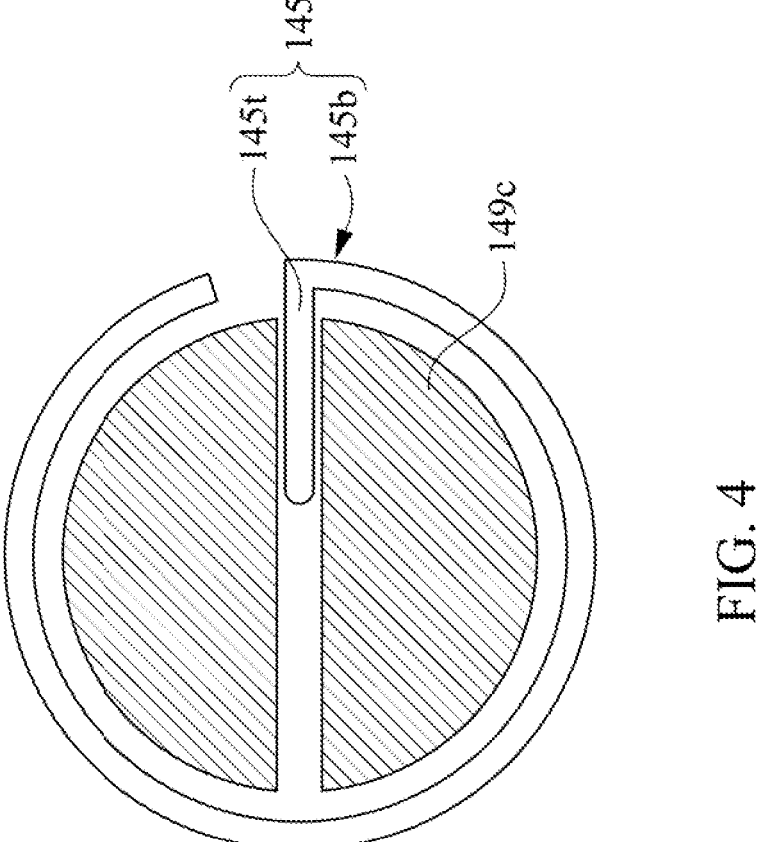
FIG. 4 illustrates a locally cross-sectional view of the scroll device in accordance with one embodiment of the present disclosure.

Referring to FIG. 2 and FIG. 4 which illustrates locally cross-sectional view of the scroll device 140 in this embodiment, but only a part of the torsion spring 145 and the connecting device 149 (not denoted in FIG. 4) are illustrated. Inside the roller 142, the split portion 149c of the connecting device 149 may be connected to the end 145b of the torsion spring 145. As shown in FIG. 4, the end 145b of the torsion spring 145 may include the strip 145t. The split portion 149c is connected and fixed to this strip 145t, for example, the split portion 149c may stuck or clamp the strip 145t, so that the end 145b of the torsion spring 145 is fastened to the connecting device 149. Since the connecting device 149 is fixed to the roller end cap 144, and the end 145b of the torsion spring 145 is fastened to the connecting device 149, the end 145b of the torsion spring 145 is not rotatable relative to the roller end cap 144.

In addition, the end 147b of the torsion spring 147 is fastened to the roller end cap 146 by the other connecting device 149, and its connection way is identical to the end 145b of the torsion spring 145, thus, the connection way is not described repeatedly herein. It is worth mentioning, the connecting device 149 of the disclosure is not limited to be a split rivet in this embodiment. In other embodiment, the connecting device 149 may be any component which is able to fasten the torsion spring 145 (or the torsion spring 147) to the roller end cap 144 (or the roller end cap 146).

Referring to FIG. 2, FIG. 3A and FIG. 3B, when the roller 142 rotates relative to the roller end cap 144 (and the roller end cap 146) on the axis 142a, the fastening device 143 of the roller 142 may make the end 145a of the torsion spring 145 rotate relative to the roller end cap 144 on the axis 142a of the roller 142. On the other hand, since the end 145b of the torsion spring 145 is fastened to the roller end cap 144 by the connecting device 149, the end 145b of the torsion spring 145 rotates relative to the roller 142 when the roller end cap 144 rotates relative to the roller 142. That is, the relative rotation between the roller 142 and the roller end cap 144 twists the torsion spring 145. Furthermore, the end 145a of the torsion spring 145 which is connected to the roller 142 and the end 145b of the torsion spring 145 which is connected to the roller end cap 144 rotate relative to each other. In the embodiment, the rotation way of the torsion spring 147 is identical to the torsion spring 145, thus, the rotation way of the torsion spring 145 is not described repeatedly herein.

It is worth mentioning, the end 145a of the torsion spring 145 rotates relative to the end 145b on the axis 142a of the roller 142. This relative rotation may make the torsion spring 145 deform to form a restoring force.

Figures 5A, 5B:
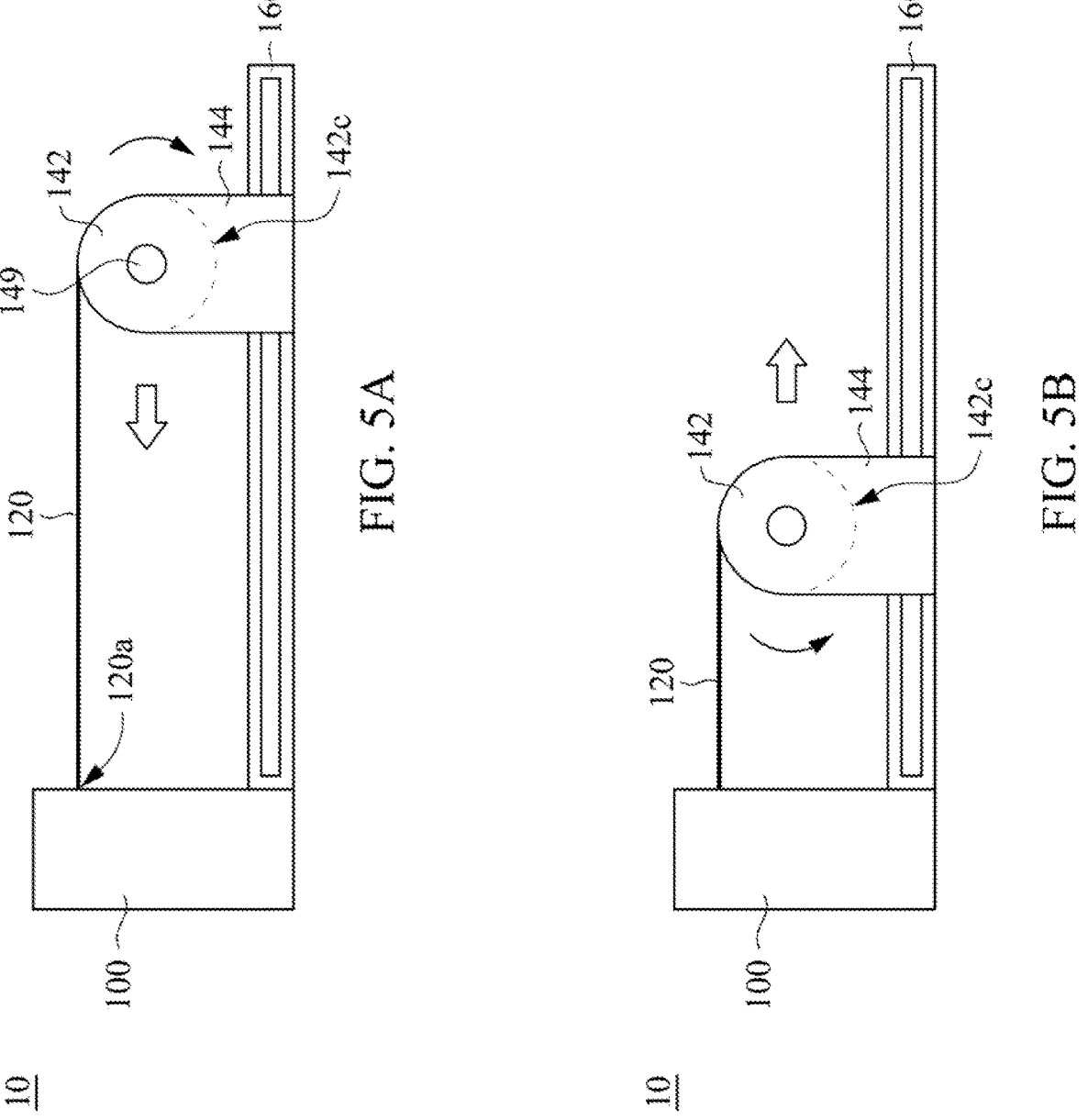
FIG. 5A to FIG. 5B illustrates a side view of a scrollable display in accordance with one embodiment of the present disclosure.

FIG. 5A and FIG. 5B illustrate the scrollable display 10 of the embodiment in two states. When the flexible display panel 120 is in the first state (i.e. the flexible display panel 120 is rolled up) shown in FIG. 5A, the torsion spring 145 drives the roller 142 to rotate relative to the roller end cap 144, so that the flexible display panel 120 is rolled up on the roller 142 and is curled on the cylindrical surface 142c. In addition, when the flexible display panel 120 is in the second state (i.e. the flexible display panel 120 is unrolled) shown in FIG. 5B, the partial of the flexible display panel 120 which is located between the fixture 100 and the roller 142 is spread out.

Referring to FIG. 1, FIG. 5A and FIG. 5B, the scrollable display 10 further includes the driving device 160 which is connected to the roller end cap 144 and is used to move the roller end cap 144, so that the roller end cap 144 moves relative to the fixture 100. The driving device 160 may be equipped with motors (not shown), and the roller end cap 144 may be disposed on the driving device 160 with the screws 170. Specifically, the driving device 160 has two tracks separately located on its two opposite sides, and these two tracks are located between the two end parts 142p of the roller 142 (i.e. the roller end cap 144 and the roller end cap 146). As shown in FIG. 1, one of the screws 170 is connected to one track through the roller end cap 144, while the other one of the screws 170 is connected to the other track through the roller end cap 146. Thus, the roller end cap 144 and the roller end cap 146 which are disposed on the tracks of the driving device 160 are rotatable. As a result, the driving device 160 in the first state drives the roller end cap 144 to move toward the fixture 100. As shown in FIG. 5A, the roller end cap 144 moves along the direction of the hollow arrow, while the roller 142 rotates along the direction of the solid arrow. The driving device 160 in the second state drives the roller end cap 144 to move away from the fixture 100. Thus, as shown in FIG. 5B, the roller end cap 144 moves along the direction of the hollow arrow, while the roller 142 rotates along the direction of the solid arrow.

As shown in FIG. 1 and FIG. 5B, since the roller 142 is connected to the roller end cap 144 through the connecting device 149, the roller 142 following up the roller end cap 144 moves away from the fixture 100 when the driving device 160 drives the roller end cap 144 to move away from the fixture 100. The side surface 120a of the flexible display panel 120 is connected to the fixture 100, and the side surface 120b is connected to the roller 142, and then the flexible display panel 120 is curled on the cylindrical surface 142c. Therefore, when the roller 142 moves away from the fixture 100, the flexible display panel 120 produce a tension which may drive the roller 142 to rotate relative to the roller end cap 144. Furthermore, in this embodiment, the roller end cap 146 and the roller end cap 144 may be symmetry to each other and may move and rotate synchronously. Thus, the wrinkles and damages may be prevented from emerging on the flexible display panel 120.

As above, a relative rotation between the roller 142 and the roller end cap 144 is performed in the second state, and this relative rotation makes the torsion spring 145 connecting the roller 142 with the roller end cap 144 twist and deform increasingly, and thus a restoring force is produced. In addition, the torsion spring 147 in the second state twists and deforms increasingly, and thus a restoring force is produced. The restoring force produced by the torsion spring 145 and the torsion spring 147 is used to draw the flexible display panel 120, so that the partial of the flexible display panel 120 located between the fixture 100 and the roller 142 is unrolled.

When the driving device 160 drives the roller end cap 144 to move toward the fixture 100, the tension on the flexible display panel 120 is decreased. As a result, the torsion spring 145 and the torsion spring 147 relax increasingly, and thus the deformation caused by the twisting recovers. This recovery can drive the roller 142 to rotate relative to the roller end cap 144 (and the roller end cap 146), and then the first state shown in FIG. 5A is performed. The rotation directions of the first state and the second state are opposite, so that the flexible display panel 120 in the first state is curled on the cylindrical surface 142c.

It should be noted that the aforementioned first state and the second state may represent any instantaneous state of the scrollable display 10. For instance, the first state may be any instantaneous moment when the flexible display panel 120 is rolling up, and the second state may be any instantaneous moment when the flexible display panel 120 is unrolled.

Figure 6:
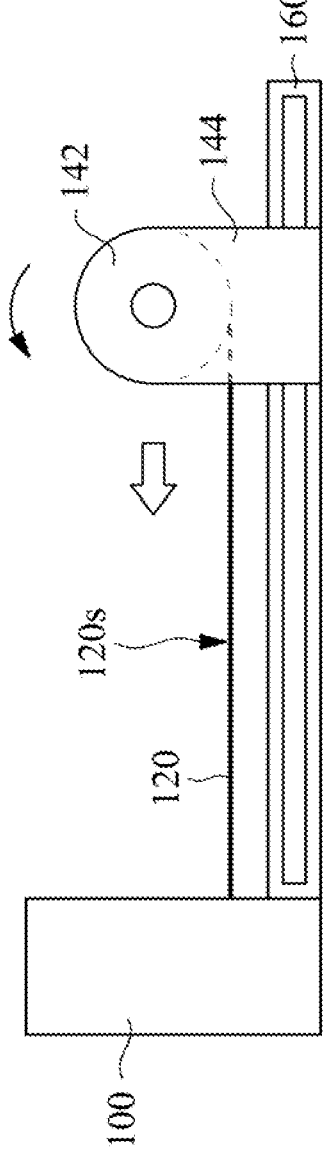
FIG. 6 illustrates a side view of a scrollable display in accordance with another embodiment of the present disclosure.

The scrollable display in this embodiment is outside-winding. Specifically, the roller 142 is connected to and directly touches the surface 120s of the flexible display panel 120, and the surface 120s faces the driving device 160. However, the scrollable display in other embodiments may be inside-winding as shown in FIG. 6, where the surface 120s of the flexible display panel 120 backs on to the driving device 160.

In another embodiment, when the distance between the roller 142 and the fixture 100 is minimal, the torsion spring 145 has a restoring force. In other words, when the roller 142 is the nearest to the fixture 100, the torsion spring 145 already has the restoring force. This restoring force is used to draw the flexible display panel 120, and thus the flexible display panel 120 is able to cling to the cylindrical surface 142c. Further, the restoring force provides additional tension which flattens the surface 120s of the flexible display panel 120 when the scrollable display 10 is in the second state.

Figure 7:
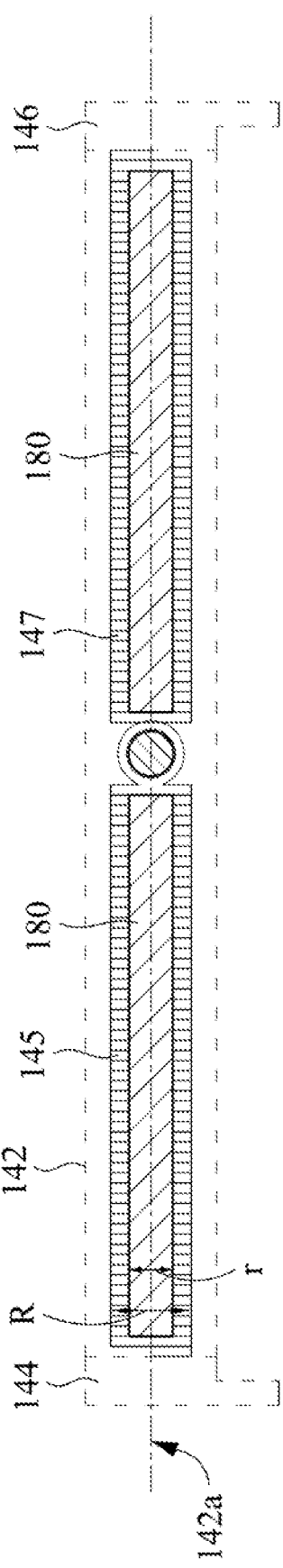
FIG. 7 illustrates a locally side view of a scroll device in accordance with another embodiment of the present disclosure.

Referring to FIG. 7, in another embodiment, the scroll device 140 may further include two bracing rods 180. One of the bracing rods 180 is located inside the torsion spring 145 (and the torsion spring 147). The axis of each of the bracing rods 180 extends along the extending direction of the torsion spring 145 (and the torsion spring 147), that is, the axis of the each of the bracing rods 180 extends along the axis 142a of the roller 142. The bracing rods 180 in this embodiment are cylinder, and the diameter r of each of the bracing rods 180 should be slightly smaller than the diameter R of the torsion spring 145 since the bracing rods 180 should be disposed inside the torsion spring 145 (and the torsion spring 147).

In this embodiment, the length of each of the bracing rods 180 is less than or equal to the length of the torsion spring 145 (and the torsion spring 147). However, the length of each of the bracing rods 180 is not limited to the embodiment, that is, the length of each of the bracing rods 180 may be longer than the length of the torsion spring 145. The bracing rods 180 may district the degree of the deformation of the torsion spring 145 (and the torsion spring 147) when the torsion spring 145 (and the torsion spring 147) is producing the restoring force, so that the elastic fatigue due to excessive deformation is prevented.

It is worth mentioning, although each scrollable display disclosed in aforementioned embodiments has two roller end caps and two torsion springs, the quantities of roller end cap and torsion spring of one scrollable display in other embodiments are not limited to two. That is, the scrollable display may have one roller end cap and one torsion spring.

In conclusion, two ends of the torsion spring are connected to the roller end cap and the roller separately in the scrollable display. When the roller and the roller end cap are driven to move and the flexible display panel is unrolled, the tension of the flexible display panel makes the roller rotate relative to the roller end cap. Thus, two ends of the torsion spring are driven by the roller and the roller end cap separately, so that these two ends rotate in opposite directions separately. The restoring force produced from the twisting deformation of the torsion spring may make the roller and the roller end cap rotate in reverse direction of the twisting. Therefore, the flexible display panel can be rolled up on the roller. Furthermore, the scrollable display of the present disclosure does not need the motors for its rotation since the restoring force driving the flexible display panel to curl is provided by the torsion spring. As a result, the dimension of the display may be minified, and the circuit design and the mechanical structure may be simplified.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure. Therefore, the protection scope of the embodiments of the present disclosure should be determined according to the scope of the appended claims.

What is claimed is:

1. A scrollable display comprising:

a fixture;

a flexible display panel having a first side and a second side opposite to the first side, wherein the first side is connected to the fixture; and a scroll device comprising:

a first roller end cap;

a roller has a cylindrical surface, and the second side of the flexible display panel is connected to the cylindrical surface of the roller, wherein one of two end parts of the roller disposed on the first roller end cap is rotatable, and the roller is able to rotate relative to the first roller end cap; and a first torsion spring located inside the roller, wherein two ends of the first torsion spring are connected to the roller and the first roller end cap separately, wherein a relative rotation between the roller and the first roller end cap makes the first torsion spring twist; and a driving device for moving the first roller end cap relative to the fixture is connected to the first roller end cap, wherein the driving device has two tracks separately located on two opposite sides of the driving device, and the two tracks are located between the two end parts of the roller;

when the flexible display panel is in a first state, the first torsion spring drives the roller to rotate relative to the first roller end cap, and the flexible display panel is rolled up on the roller and is curled on the cylindrical surface;

when the flexible display panel is in a second state, a part of the flexible display panel between the fixture and the roller is unrolled, wherein the first torsion spring in the second state deforms to form a first restoring force, and the first restoring force drives the roller to draw the flexible display panel.

2. The scrollable display of claim 1, wherein the driving device in the first state drives the first roller end cap to move toward the fixture;

wherein the driving device in the second state drives the first roller end cap to move away from the fixture.

3. The scrollable display of claim 2, wherein the roller is connected to and directly touches a surface of the flexible display panel, and the surface faces the driving device.

4. The scrollable display of claim 2, wherein the roller is connected to and directly touches a surface of the flexible display panel, and the surface backs on to the driving device.

5. The scrollable display of claim 1, wherein the scroll device further comprising:

a bearing located between the roller and the first roller end cap, and the bearing allows the roller and the first roller end cap to rotate relative to each other.

6. The scrollable display of claim 1, wherein the scroll device further comprising:

a bracing rod located inside the first torsion spring, wherein an axis of the bracing rod extends along an extending direction of the first torsion spring, and a length of the bracing rod is less than a length of the first torsion spring.

7. The scrollable display of claim 1, wherein the scroll device further comprising:

a bracing rod located inside the first torsion spring, wherein an axis of the bracing rod extends along an extending direction of the first torsion spring, and a length of the bracing rod is equal to a length of the first torsion spring.

8. The scrollable display of claim 1, wherein the roller further comprising:

a fastening device fastened inside the roller, and one end of the first torsion spring is connected to the fastening device.

9. The scrollable display of claim 8, wherein the scroll device further comprising:

a second roller end cap, wherein the other end part of the roller disposed on the second roller end cap is rotatable, and the roller is able to rotate relative to the second roller end cap, wherein the roller is located between the first roller end cap and the second roller end cap; and a second torsion spring located inside the roller, and two ends of the second torsion spring are connected to the fastening device and the second roller end cap separately, wherein the fastening device is located between the first torsion spring and the second torsion spring;

wherein the second torsion spring in the second state deforms to form a second restoring force, and the second restoring force drives the roller to draw the flexible display panel.

10. The scrollable display of claim 1, wherein the first torsion spring has a third restoring force when a distance between the roller and the fixture is minimal, and the third restoring force is used to draw the flexible display panel.

11. A scroll device, comprising:

a roller;

a first roller end cap, wherein one of two end parts of the roller disposed on the first roller end cap is rotatable, and the roller is able to rotate relative to the first roller end cap;

a first torsion spring located inside the roller, and two ends of the first torsion spring are fastened to the roller and the first roller end cap separately;

a second roller end cap, wherein the other one of two end parts of the roller disposed on the second roller end cap is rotatable, and the roller is able to rotate relative to the second roller end cap;

a second torsion spring located inside the roller, and two ends of the second torsion spring are connected to the roller and the second roller end cap separately;

a first bracing rod located inside the first torsion spring, wherein an axis of the first bracing rod extends along an extending direction of the first torsion spring; and a second bracing rod located inside the second torsion spring, wherein an axis of the second bracing rod extends along an extending direction of the second torsion spring.

12. The scroll device of claim 11, further comprising:

a bearing located between the roller and the first roller end cap, and the bearing allows the roller and the first roller end cap to rotate relative to each other.

13. The scroll device of claim 11, wherein the roller further comprising:

a fastening device fastened inside the roller, and one of the two ends of the first torsion spring is connected to the fastening device.

\* \* \* \* \*